(12) United States Patent
Song

(10) Patent No.: US 9,804,459 B2
(45) Date of Patent: Oct. 31, 2017

(54) ARRAY SUBSTRATE AND MANUFACTURE METHOD THEREOF

(71) Applicant: Shenzhen China Star Optoelectronics Technology Co., Ltd., Shenzhen, Guangdong (CN)

(72) Inventor: Liwang Song, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 94 days.

(21) Appl. No.: 14/424,007

(22) PCT Filed: Feb. 8, 2015

(86) PCT No.: PCT/CN2015/072469
§ 371 (c)(1),
(2) Date: Feb. 25, 2015

(87) PCT Pub. No.: WO2016/086531
PCT Pub. Date: Jun. 9, 2016

(65) Prior Publication Data
US 2016/0342047 A1 Nov. 24, 2016

(30) Foreign Application Priority Data
Dec. 1, 2014 (CN) .......................... 2014 1 0717233

(51) Int. Cl.
*G02F 1/1362* (2006.01)
*G02F 1/1333* (2006.01)
(Continued)

(52) U.S. Cl.
CPC ...... *G02F 1/136209* (2013.01); *G02F 1/1333* (2013.01); *G02F 1/1335* (2013.01);
(Continued)

(58) Field of Classification Search
CPC combination set(s) only.
See application file for complete search history.

(56) References Cited

U.S. PATENT DOCUMENTS

2004/0109098 A1 6/2004 Kim
2010/0003774 A1* 1/2010 Liao .................. G02F 1/136209
438/29

(Continued)

*Primary Examiner* — Kyoung Lee
*Assistant Examiner* — Ratisha Mehta
(74) *Attorney, Agent, or Firm* — Andrew C. Cheng

(57) ABSTRACT

The present invention provides an array substrate and a manufacture method thereof. The array substrate, by locating both a black matrix and a color resist layer on the array substrate, and locating the color resist layer on the TFT layer prevents the bad influence to the color resist layer from the high temperature TFT process, and accordingly to make the liquid crystal panel with higher display quality. The manufacture method of the array substrate, first forms a black matrix on the substrate, and second implements TFT manufacture process on the black matrix, and then forms a color resist layer after the TFT manufacture. Accordingly, both the black matrix and the color resist layer manufactured on the array substrate can be achieved, and with forming the color resist layer after the TFT manufacture to prevent the bad phenomenon due to bubbles generated by the color resist volatilization from the high temperature TFT process, and accordingly to effectively make the liquid crystal panel with higher display quality and raise production yield.

7 Claims, 3 Drawing Sheets

(51) Int. Cl.
*G02F 1/1335* (2006.01)
*G02F 1/1343* (2006.01)
*G02F 1/1368* (2006.01)
*H01L 27/12* (2006.01)
*H01L 29/24* (2006.01)
*H01L 29/49* (2006.01)
*H01L 29/786* (2006.01)

(52) U.S. Cl.
CPC ........ *G02F 1/1368* (2013.01); *G02F 1/13439* (2013.01); *G02F 1/133345* (2013.01); *G02F 1/134309* (2013.01); *H01L 27/127* (2013.01); *H01L 27/1218* (2013.01); *H01L 27/1222* (2013.01); *H01L 27/1225* (2013.01); *H01L 27/1248* (2013.01); *H01L 29/24* (2013.01); *H01L 29/4908* (2013.01); *H01L 29/78618* (2013.01); *H01L 29/78666* (2013.01); *H01L 29/78696* (2013.01); *G02F 2001/13685* (2013.01); *G02F 2001/133302* (2013.01); *G02F 2001/136222* (2013.01); *G02F 2201/123* (2013.01); *G02F 2202/103* (2013.01); *H01L 29/7869* (2013.01)

(56) References Cited

U.S. PATENT DOCUMENTS

| | | | |
|---|---|---|---|
| 2013/0153884 A1* | 6/2013 | Ichikawa | C07D 471/04 257/40 |
| 2014/0008649 A1* | 1/2014 | Umeda | H01L 29/7869 257/43 |
| 2014/0104527 A1* | 4/2014 | Yang | H01L 27/1225 349/43 |
| 2015/0221681 A1* | 8/2015 | Guo | G02F 1/136209 257/347 |

* cited by examiner

ARRAY SUBSTRATE AND MANUFACTURE METHOD THEREOF

FIELD OF THE INVENTION

The present invention relates to a display technology field, and more particularly to an array substrate and a manufacture method thereof.

BACKGROUND OF THE INVENTION

The LCD (Liquid Crystal Display) possesses many advantages of being ultra thin, power saved and radiation free. It has been widely utilized in, such as LCD TVs, mobile phones, PDAs, digital cameras, laptop screens or notebook screens. Most of LCDs on the market are backlight type LCDs, comprising a Backlight module and a liquid crystal panel combined with the Backlight module.

In the TFT-LCD (Thin Film Transistor Liquid Crystal Display), a BM (Black Matrix) is manufactured on the substrate in general, which is employed for diving the adjacent color resists for shielding the gaps among the color resists to prevent the light leakage or color mixture, and the technology of manufacturing the black matrix on the TFT array substrate is named BOA (BM On Array, the black matrix is attached on the array substrate), and BOA can solve the issue that the light resist areas are mismatched due to the mis-alignment of the upper, lower substrates.

Meanwhile, COA (Color Filter On Array, the color resist layer is attached on the array substrate) is proposed for promoting the display quality of the TFT-LCD (Thin Film Transistor Liquid Crystal Display).

As shown in FIG. 1, as the BOA and COA technologies are applied to the array substrate 100, the black matrix 200 and the color resist layer 300 are formed at the same layer for utilizing the spray coating technology. The color resist layer 300 will suffer the high temperature PVD (Physical vapor deposition) and CVD (Chemical vapor deposition) processes in the TFT manufacture process, which can seriously influence the performance of the color resist layer 300, and besides, the high temperature process will make the volatilization of the color resist layer 300 to generate gas and the gas becomes the source of the bubbles. The production yield is descended.

SUMMARY OF THE INVENTION

An objective of the present invention is to provide an array substrate, by locating both a black matrix and a color resist layer on the array substrate, and locating the color resist layer on the TFT layer to prevent the bad influence to the color resist layer from the high temperature TFT process, and accordingly to make the liquid crystal panel with higher display quality.

Another objective of the present invention is to provide a manufacture method of an array substrate, first to form a black matrix on the substrate, and second to implement TFT manufacture process on the black matrix, and then to form a color resist layer after the TFT manufacture. Accordingly, both the black matrix and the color resist layer manufactured on the array substrate can be achieved, and with forming the color resist layer after the TFT manufacture to prevent the bad phenomenon due to bubbles generated by the color resist volatilization from the high temperature TFT process, and accordingly to effectively make the liquid crystal panel with higher display quality and raise production yield.

For realizing the aforesaid objective, the present invention provides an array substrate, comprising a substrate, a black matrix located on the substrate, a TFT layer located on the black matrix, a color resist layer located on the TFT layer, a second passivation layer and a pixel electrode layer;

the TFT layer comprises a source/a drain located on the black matrix, a semiconductor layer located on the source/the drain, a gate isolation layer located on the semiconductor layer, a gate located on the gate isolation layer and a first passivation layer located on the gate.

The color resist layer is located on the first passivation layer, the second passivation layer is located on the color resist layer, and the pixel electrode layer is located on the second passivation layer, and the array substrate further comprises a via hole penetrating the second passivation layer, the color resist layer, the first passivation layer, the gate isolation layer and the semiconductor layer, and the pixel electrode layer is electrically connected with the source/the drain by the via hole.

The pixel electrode layer comprises a first ITO electrode layer and a second ITO electrode layer, and the first ITO electrode layer is located on the first passivation layer, and the array substrate further comprises a via hole penetrating the first passivation layer, the gate isolation layer and the semiconductor layer, and the first ITO electrode layer is electrically connected with the source/the drain by the via hole, and the color resist layer is located on the first ITO electrode layer, and the second passivation layer is located on the color resist layer, and the second ITO electrode layer is located on the second passivation layer, and the first ITO electrode layer and the second ITO electrode layer are connected to together form the pixel electrode layer.

Material of the source/the drain and the gate is copper or aluminum.

The semiconductor layer is a double layer structure comprising an amorphous silicon layer and a heavy doped N type silicon layer, or a single layer structure, comprising an Indium Gallium Zinc Oxide layer.

The present invention further provides a manufacture method of an array substrate, comprising steps of:

step 1, providing the substrate and forming a black matrix on the substrate step 2, manufacturing a TFT layer on the black matrix;

step 3, forming a color resist layer, a second passivation layer and a pixel electrode layer on the TFT layer and the substrate;

the step 2 comprises steps of:

step 21, deposing and patterning a first metal layer on the black matrix to form a source/a drain;

step 22, forming a semiconductor layer on the source/the drain, and forming a gate isolation layer on the semiconductor layer;

step 23, deposing and patterning a second metal layer on the gate isolation layer to form a gate;

step 24, forming a first passivation layer on the gate.

the step 3 comprises steps of:

step 31, forming a color resist layer on the first passivation layer, and forming a second passivation layer on the color resist layer;

step 32, forming a via hole in the second passivation layer, the color resist layer, the first passivation layer, the gate isolation layer and the semiconductor layer;

step 33, forming a pixel electrode layer on the second passivation layer, and the pixel electrode layer is electrically connected with the source/the drain by the via hole.

the step 3 comprises steps of:

step 31, forming a via hole in the first passivation layer, the gate isolation layer and the semiconductor layer;

step 32, forming a first ITO electrode layer, and the first ITO electrode layer is electrically connected with the source/the drain by the via hole;

step 33, forming a color resist layer on the first ITO electrode layer, and forming a second passivation layer on the color resist layer;

step 34, forming a second ITO electrode layer on the second passivation layer, and the first ITO electrode layer and the second ITO electrode layer are connected to together form the pixel electrode layer.

Material of the source/the drain and the gate is copper or aluminum.

The semiconductor layer is a double layer structure comprising an amorphous silicon layer and a heavy doped N type silicon layer, or a single layer structure, comprising an Indium Gallium Zinc Oxide layer.

The present invention further provides an array substrate, comprising a substrate, a black matrix located on the substrate, a TFT layer located on the black matrix, a color resist layer located on the TFT layer, a second passivation layer and a pixel electrode layer;

the TFT layer comprises a source/a drain located on the black matrix, a semiconductor layer located on the source/the drain, a gate isolation layer located on the semiconductor layer, a gate located on the gate isolation layer and a first passivation layer located on the gate;

wherein the color resist layer is located on the first passivation layer, the second passivation layer is located on the color resist layer, and the pixel electrode layer is located on the second passivation layer, and the array substrate further comprises a via hole penetrating the second passivation layer, the color resist layer, the first passivation layer, the gate isolation layer and the semiconductor layer, and the pixel electrode layer is electrically connected with the source/the drain by the via hole;

wherein material of the source/the drain and the gate is copper or aluminum.

The benefits of the present invention are: the present invention provides an array substrate, and applies BOA and COA technology on the array substrate at the same time, i.e. locating both the black matrix and the color resist layer on the array substrate. The color resist layer is located on the TFT layer and the black matrix to prevent the color resist from the high temperature TFT process and eliminate the source of the bubble source in the liquid crystal display panel. Meanwhile, the TFT layer utilizes the top gate TFT structure to prevent the leakage of the BOA structure array substrate, and accordingly, the display quality of the liquid crystal panel is effectively promoted. The present invention provides a manufacture method of an array substrate, and applies BOA and COA technology on the array substrate at the same time. First forms a black matrix on the substrate, and second implements TFT manufacture process on the black matrix, and then forms a color resist layer after the TFT manufacture. Accordingly, both the black matrix and the color resist layer manufactured on the array substrate can be achieved, and with forming the color resist layer after the TFT manufacture to prevent the bad phenomenon due to bubbles generated by the color resist volatilization from the high temperature TFT process, and meanwhile, the TFT layer utilizes the top gate TFT structure to prevent the leakage of the BOA structure array substrate, and accordingly, the display quality of the liquid crystal panel is effectively promoted and production yield is raised.

BRIEF DESCRIPTION OF THE DRAWINGS

The technical solution and the beneficial effects of the present invention are best understood from the following detailed description with reference to the accompanying figures and embodiments.

In drawings.

DETAILED DESCRIPTION OF PREFERRED EMBODIMENTS

For better explaining the technical solution and the effect of the present invention, the present invention will be further described in detail with the accompanying drawings and the specific embodiments.

Figure 1:
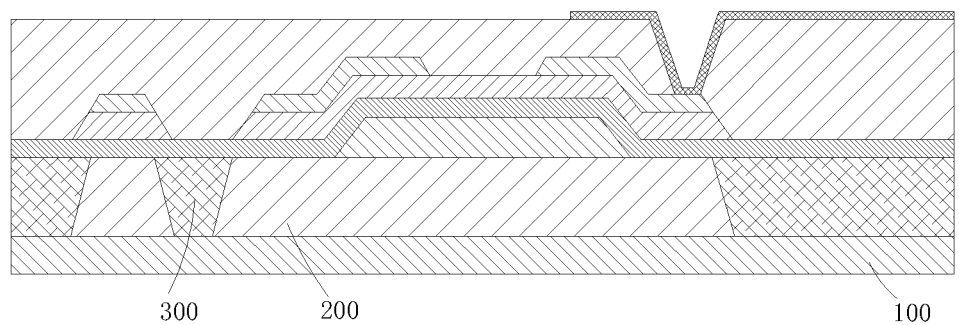
FIG. 1 is a sectional diagram of a TFT substrate structure according to prior art.
Figure 2:
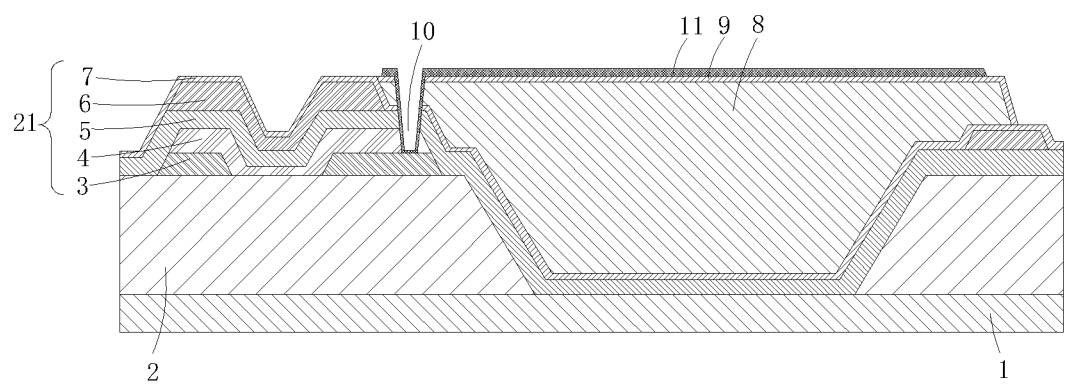
FIG. 2 is a sectional diagram of a TFT substrate structure according to the first embodiment of the present invention.

The present invention provides an array substrate, and applies BOA and COA technology on the array substrate at the same time, i.e. locating both the black matrix and the color resist layer on the array substrate. The color resist layer is located on the TFT layer and the black matrix to prevent the color resist from the high temperature TFT process and eliminate the source of the bubble source in the liquid crystal display panel. Please refer to FIG. 2, which is a sectional diagram of a TFT substrate structure according to the first embodiment of the present invention. In the first embodiment, the array substrate comprises a substrate 1, a black matrix 2 located on the substrate 1, a TFT layer 21 located on the black matrix 2, a color resist layer 8 located on the TFT layer 21, a second passivation layer 9 and a pixel electrode layer 11.

Preferably, the substrate 1 is a glass substrate.

Preferably, for preventing the leakage of the BOA type array substrate, the TFT layer 21 is selected to be a top gate type TFT structure, and the TFT layer 21 comprises a source/a drain 3 located on the black matrix 2, a semiconductor layer 4 located on the source/the drain 3, a gate isolation layer 5 located on the semiconductor layer 4, a gate 6 located on the gate isolation layer 5 and a first passivation layer 7 located on the gate 6.

The semiconductor layer 4 can be a double layer structure comprising an a-Si (amorphous silicon) layer and an n+Si (heavy doped N type silicon) layer, or a single layer structure, comprising an IGZO (Indium Gallium Zinc Oxide) layer.

Preferably, material of the source/the drain 3 and the gate 6 is copper or aluminum.

Preferably, material of the gate isolation layer 5 is silicon nitride.

wherein the color resist layer 8 is located on the first passivation layer 7, the second passivation layer 9 is located on the color resist layer 8, and the pixel electrode layer 11 is located on the second passivation layer 9, and the array substrate further comprises a via hole 10 penetrating the second passivation layer 9, the color resist layer 8, the first passivation layer 7, the gate isolation layer 5 and the semiconductor layer 4, and the pixel electrode layer 11 is electrically connected with the source/the drain 3 by the via hole 10.

Preferably, both material of the first passivation layer 7 and material of the second passivation layer 9 are silicon nitride.

Preferably, material of the pixel electrode layer 11 is Indium Tin Oxide.

Figure 4:
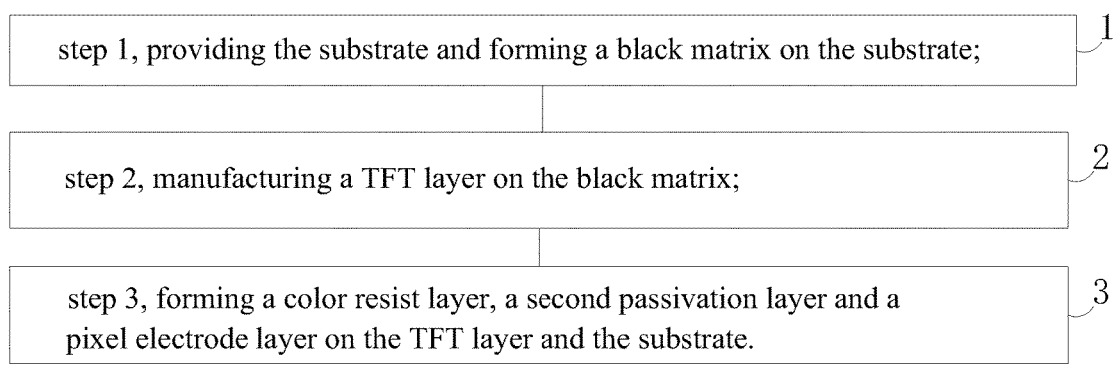
FIG. 4 is a flowchart of a manufacture method of a TFT substrate according to the present invention.

Please refer to FIG. 4, which is a flowchart of a manufacture method of a TFT substrate according to the present invention, and for obtaining the array substrate according to the first embodiment of the present invention, the present invention further provides a manufacture method of the array substrate, comprising steps of:

step 1, providing the substrate 1 and forming a black matrix 2 on the substrate.

Specifically, the substrate 1 in the step 1 is a glass substrate, and the black matrix 2 is manufactured on the substrate 1 by coating process.

step 2, manufacturing a TFT layer 21 on the black matrix 2.

Preferably, for preventing the leakage of the BOA type array substrate, the TFT layer 21 is selected to be a top gate type TFT structure.

Specifically, the step 2 comprises steps of:

step 21, deposing and patterning a first metal layer on the black matrix 2 to form a source/a drain 3;

preferably, material of the source/the drain 3 is copper or aluminum;

step 22, forming a semiconductor layer 4 on the source/the drain 3, and forming a gate isolation layer 5 on the semiconductor layer 4;

the semiconductor layer 4 can be a double layer structure comprising an a-Si (amorphous silicon) layer and an n+Si (heavy doped N type silicon) layer, or a single layer structure, comprising an IGZO (Indium Gallium Zinc Oxide) layer;

preferably, material of the gate isolation layer 5 is silicon nitride;

step 23, deposing and patterning a second metal layer on the gate isolation layer 5 to form a gate 6;

preferably, material of the gate 6 is copper or aluminum;

step 24, forming a first passivation layer 7 on the gate 6.

preferably, material of the first passivation layer 7 is silicon nitride.

step 3, forming a color resist layer 8, a second passivation layer 9 and a pixel electrode layer 11 on the TFT layer 21 and the substrate 1.

Specifically, the step 3 comprises steps of:

step 31, forming a color resist layer 8 on the first passivation layer 7, and forming a second passivation layer 9 on the color resist layer 8;

Specifically, the color resist layer 8 is formed by coating process;

preferably, both material of the first passivation layer 7 and material of the second passivation layer 9 are silicon nitride;

step 32, forming a via hole 10 in the second passivation layer 9, the color resist layer 8, the first passivation layer 7, the gate isolation layer 5 and the semiconductor layer 4;

specifically, the via hole 10 is formed by dry etching process;

step 33, forming a pixel electrode layer 11 on the second passivation layer 9, and the pixel electrode layer 11 is electrically connected with the source/the drain 3 by the via hole 10;

specifically, the pixel electrode layer 11 is formed by vacuum coating process and wet etching process;

preferably, material of the pixel electrode layer 11 is Indium Tin Oxide.

Figure 3:
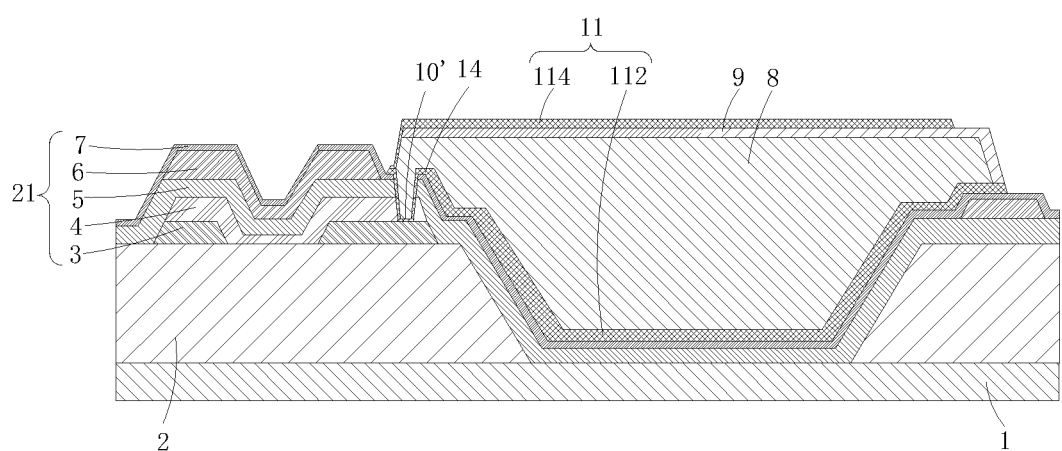
FIG. 3 is a sectional diagram of a TFT substrate structure according to the second embodiment of the present invention.

Please refer to FIG. 3, which is a sectional diagram of a TFT substrate structure according to the second embodiment of the present invention. In the second embodiment, the array substrate comprises a substrate 1, a black matrix 2 located on the substrate 1, a TFT layer 21 located on the black matrix 2, a color resist layer 8 located on the TFT layer 21, a second passivation layer 9 and a pixel electrode layer 11.

Preferably, the substrate 1 is a glass substrate.

The TFT layer 21 is a top gate type TFT, and the TFT layer 21 comprises a source/a drain 3 located on the black matrix 2, a semiconductor layer 4 located on the source/the drain 3, a gate isolation layer 5 located on the semiconductor layer 4, a gate 6 located on the gate isolation layer 5 and a first passivation layer 7 located on the gate 6.

The semiconductor layer 4 can be a double layer structure comprising an a-Si (amorphous silicon) layer and an n+Si (heavy doped N type silicon) layer, or a single layer structure, comprising an IGZO (Indium Gallium Zinc Oxide) layer.

Preferably, material of the source/the drain 3 and the gate 6 is copper or aluminum.

Preferably, material of the gate isolation layer 5 is silicon nitride.

The pixel electrode layer 11 comprises a first ITO electrode layer 112 and a second ITO electrode layer 114, and the first ITO electrode layer 112 is located on the first passivation layer 7, and the array substrate further comprises a via hole 10' penetrating the first passivation layer 7, the gate isolation layer 5 and the semiconductor layer 4, and the first ITO electrode layer 112 is electrically connected with the source/the drain 3 by the via hole 10', and the color resist layer 8 is located on the first ITO electrode layer 112, and the second passivation layer 9 is located on the color resist layer 8, and the second ITO electrode layer 114 is located on the second passivation layer 9, and the first ITO electrode layer 112 and the second ITO electrode layer 114 are connected to together form the pixel electrode layer 11.

Preferably, both material of the first passivation layer 7 and material of the second passivation layer 9 are silicon nitride.

Preferably, both material of the first ITO electrode layer 112 and material of the second ITO electrode layer 114 are Indium Tin Oxide.

Compared with the array substrate according to the first embodiment of the present invention, the merit of the array substrate according to the second embodiment of the present invention is, the via hole is not formed in the color resist layer, and therefore, the flatness of the TFT substrate can be reserved better.

Please refer to FIG. 4, which is a flowchart of a manufacture method of a TFT substrate according to the present invention, and for obtaining the array substrate according to the second embodiment of the present invention, the present invention further provides a manufacture method of the array substrate, comprising steps of:

step 1, providing the substrate 1 and forming a black matrix 2 on the substrate 1.

Specifically, the substrate 1 in the step 1 is a glass substrate, and the black matrix 2 is manufactured on the substrate 1 by coating process.

step 2, manufacturing a TFT layer 21 on the black matrix 2.

Specifically, the step 2 comprises steps of:

step 21, deposing and patterning a first metal layer on the black matrix 2 to form a source/a drain 3;

preferably, material of the source/the drain 3 is copper or aluminum.

step 22, forming a semiconductor layer 4 on the source/the drain 3, and forming a gate isolation layer 5 on the semiconductor layer 4;

the semiconductor layer 4 can be a double layer structure comprising an a-Si (amorphous silicon) layer and an n+Si (heavy doped N type silicon) layer, or a single layer structure, comprising an IGZO (Indium Gallium Zinc Oxide) layer;

preferably, material of the gate isolation layer 5 is silicon nitride.

step 23, deposing and patterning a second metal layer on the gate isolation layer 5 to form a gate 6;

preferably, material of the gate 6 is copper or aluminum.

step 24, forming a first passivation layer 7 on the gate 6;

preferably, material of the first passivation layer 7 is silicon nitride.

step 3, forming a color resist layer 8, a second passivation layer 9 and a pixel electrode layer 11 on the TFT layer 21 and the substrate 1.

Specifically, the step 3 comprises steps of:

step 31, forming a via hole 10 in the first passivation layer 7, the gate isolation layer 5 and the semiconductor layer 4;

specifically, the via hole 10' is formed by dry etching process;

step 32, forming a first ITO electrode layer 112 on the first passivation layer 7, and the first ITO electrode layer 112 is electrically connected with the source/the drain 3 by the via hole 10';

specifically, the first ITO electrode layer 112 is formed by vacuum coating process and wet etching process;

step 33, forming a color resist layer 8 on the first ITO electrode layer 112, and forming a second passivation layer 9 on the color resist layer 8;

specifically, the color resist layer 8 is formed by coating process;

preferably, material of the second passivation layer 9 is silicon nitride;

step 34, forming a second ITO electrode layer 114 on the second passivation layer 9, and the first ITO electrode layer 112 and the second ITO electrode layer 114 are connected to together form the pixel electrode layer 11.

Specifically, the second ITO electrode layer 114 is formed by vacuum coating process and wet etching process;

preferably, both material of the first ITO electrode layer 112 and material of the second ITO electrode layer 114 are Indium Tin Oxide.

Compared with the manufacture method of the array substrate according to the first embodiment of the present invention, the merit of the manufacture method of the array substrate according to the second embodiment of the present invention is, the via hole is not formed in the color resist layer, and therefore, the flatness of the TFT substrate can be reserved better.

In conclusion, the present invention provides an array substrate, and applies BOA and COA technology on the array substrate at the same time, i.e. locating both the black matrix and the color resist layer on the array substrate. The color resist layer is located on the TFT layer and the black matrix to prevent the color resist from the high temperature TFT process and eliminate the source of the bubble source in the liquid crystal display panel. Meanwhile, the TFT layer utilizes the top gate TFT structure to prevent the leakage of the BOA structure array substrate, and accordingly, the display quality of the liquid crystal panel is effectively promoted. The present invention provides a manufacture method of an array substrate, and applies BOA and COA technology on the array substrate at the same time. First forms a black matrix on the substrate, and second implements TFT manufacture process on the black matrix, and then forms a color resist layer after the TFT manufacture. Accordingly, both the black matrix and the color resist layer manufactured on the array substrate can be achieved, and with forming the color resist layer after the TFT manufacture to prevent the bad phenomenon due to bubbles generated by the color resist volatilization from the high temperature TFT process, and meanwhile, the TFT layer utilizes the top gate TFT structure to prevent the leakage of the BOA structure array substrate, and accordingly, the display quality of the liquid crystal panel is effectively promoted and production yield is raised.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. An array substrate, comprising a substrate, a black matrix located on the substrate, a TFT layer located on the black matrix, a color resist layer located on the TFT layer, a second passivation layer and a pixel electrode layer;

wherein the TFT layer comprises a source/a drain located on the black matrix, a semiconductor layer located on the source/the drain, a gate isolation layer located on the semiconductor layer, a gate located on the gate isolation layer and a first passivation layer located on the gate; and wherein the color resist layer is arranged above and separated from the black matrix.

2. The array substrate according to claim 1, wherein the color resist layer is located on the first passivation layer, the second passivation layer is located on the color resist layer, and the pixel electrode layer is located on the second passivation layer, and the array substrate further comprises a via hole penetrating the second passivation layer, the color resist layer, the first passivation layer, the gate isolation layer and the semiconductor layer, and the pixel electrode layer is electrically connected with the source/the drain by the via hole.

3. The array substrate according to claim 1, wherein the pixel electrode layer comprises a first ITO electrode layer and a second ITO electrode layer, and the first ITO electrode layer is located on the first passivation layer, and the array substrate further comprises a via hole penetrating the first passivation layer, the gate isolation layer and the semiconductor layer, and the first ITO electrode layer is electrically connected with the source/the drain by the via hole, and the color resist layer is located on the first ITO electrode layer, and the second passivation layer is located on the color resist layer, and the second ITO electrode layer is located on the second passivation layer, and the first ITO electrode layer and the second ITO electrode layer are connected to together form the pixel electrode layer.

4. The array substrate according to claim 1, wherein a material of the source/the drain and the gate is copper or aluminum.

5. The array substrate according to claim 1, wherein the semiconductor layer is a double layer structure comprising an amorphous silicon layer and a heavy doped N type silicon layer, or a single layer structure comprising an Indium Gallium Zinc Oxide layer.

6. An array substrate, comprising a substrate, a black matrix located on the substrate, a TFT layer located on the black matrix, a color resist layer located on the TFT layer, a second passivation layer and a pixel electrode layer;
   wherein the TFT layer comprises a source/a drain located on the black matrix, a semiconductor layer located on the source/the drain, a gate isolation layer located on the semiconductor layer, a gate located on the gate isolation layer and a first passivation layer located on the gate;
   wherein the color resist layer is located on the first passivation layer, the second passivation layer is located on the color resist layer, and the pixel electrode layer is located on the second passivation layer, and the array substrate further comprises a via hole penetrating the second passivation layer, the color resist layer, the first passivation layer, the gate isolation layer and the semiconductor layer, and the pixel electrode layer is electrically connected with the source/the drain by the via hole;
   wherein a material of the source/the drain and the gate is copper or aluminum; and
   wherein the color resist layer is arranged above and separated from the black matrix.

7. The array substrate according to claim 6, wherein the semiconductor layer is a double layer structure comprising an amorphous silicon layer and a heavy doped N type silicon layer, or a single layer structure comprising an Indium Gallium Zinc Oxide layer.

\* \* \* \* \*